(12) United States Patent
Sasaki et al.

(10) Patent No.: US 6,356,449 B1
(45) Date of Patent: Mar. 12, 2002

(54) FLEXIBLE PRINTED CIRCUIT BOARD MOUNTING STRUCTURE AND RECORDING/REPRODUCING DEVICE USING THE SAME

(75) Inventors: Shinkichi Sasaki; Takashi Nakagawa; Mutsumi Ito, all of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/660,839

(22) Filed: Sep. 13, 2000

(30) Foreign Application Priority Data

Sep. 14, 1999 (JP) .............................. 11-259930

(51) Int. Cl.$^7$ ................................. H05K 1/00
(52) U.S. Cl. ..................... 361/749; 439/67; 439/492; 361/802; 361/807; 235/406
(58) Field of Search ................. 361/801, 802, 361/796, 807–810, 748, 749, 752, 753, 756; 235/406, 475, 492; 439/67, 492, 493

(56) References Cited

U.S. PATENT DOCUMENTS

| | | | |
|---|---|---|---|
| 4,665,453 A | * 5/1987 | Mikamoto et al. | ......... 360/96.6 |
| 5,123,004 A | * 6/1992 | Arai | ............................ 369/75.2 |
| 5,446,240 A | 8/1995 | Hayakawa et al. | |
| 5,724,210 A | * 3/1998 | Sawada | .................... 360/99.06 |
| 5,828,520 A | * 10/1998 | Nakagawa et al. | .......... 360/104 |
| 6,146,189 A | * 11/2000 | Nomura et al. | ............. 439/493 |
| 6,219,324 B1 | * 4/2001 | Sato et al. | .................. 369/75.2 |

\* cited by examiner

Primary Examiner—Jayprakash N. Gandhi
Assistant Examiner—Thanh S Phan
(74) Attorney, Agent, or Firm—Brinks Hofer Gilson & Lione

(57) ABSTRACT

This invention relates to a flexible printed circuit board mounting structure capable of easily soldering an FPC to a printed circuit board. When the flexible printed circuit board (FPC) is soldered upright on the printed circuit board, the FPC holder is secured in the mounting hole of the printed circuit board by the pressure of the elastic portion, to thereby hold the FPC holder by a support projection cut and raised from a chassis. In this state, the terminal portion of the FPC is soldered to the edge portion of the mounting hole of the printed circuit board, thereby ensuring electrical connection of each circuit pattern of the FPC and the printed circuit board.

3 Claims, 10 Drawing Sheets

FLEXIBLE PRINTED CIRCUIT BOARD MOUNTING STRUCTURE AND RECORDING/REPRODUCING DEVICE USING THE SAME

BACKGROUND OF THE INVENTION

1. Field of the Invention

The present invention relates to a recording/reproducing device using a recording/reproducing disk such as a floppy disk and a hard disk and, more particularly, to a structure for mounting a flexible printed circuit board (hereinafter referred to as FPC) for transmitting a signal to a magnetic head, and a recording/reproducing device using the same.

2. Description of Related Art

A recording/reproducing device using a conventional structure for installing an FPC, as shown in FIG. 11, is provided with a square through hole 51c in the corner section of a chassis 51 made of a metal plate. Below the chassis 51, a printed circuit board 52 is attached to partly cover the underside thereof.

The printed circuit board 52 has a couple of long mounting holes 52a in the corner section. On the underside of the printed circuit board 52, a circuit pattern 52b (FIG. 12) is provided. On the chassis 51, a head device 55 is located for writing an information signal into, or reading an information signal from, an unillustrated magnetic disk. The head device 55 has a carriage 56 which can reciprocate in the direction (in the direction of the arrow A in the drawing) of magnetic disk insertion or removal. The carriage 56 is comprised of a head mounting base 56a located below, and an upwardly slidable head support arm 57. At the forward end of the head mounting base 56a and the head support arm 57, a pair of magnetic head 58 are mounted in mutually opposite positions.

The pair of magnetic heads 58 are connected with one end of the FPC's 60 and 61; the other ends of the FPC's 60 and 61 are free ends.

On the free end side of the FPC's 60 and 61, terminal portion 60a and 61a are formed in an exposed state.

An FPC holder 62 is a member made of a resin having a U-shaped cross section, and is provided with lower end portions 62b and 62c projecting downwardly for insertion into the through hole 51a of the chassis 51.

In the FPC's 60 and 61 connected to the pair of magnetic head 58, the terminal portions 60a and 61a on the free end side thereof are attached to the FPC holder 62, and fitted to the mounting hole 52a of the printed circuit board 52, being connected to the circuit pattern 52b (FIG. 12). As shown in FIG. 12, the FPC holder 62 fitted with a couple of FPC's 60 and 61 is inserted through the through hole 51a of the chassis 51, with the lower end portions 62b and 62c of the FPC holder 62 inserted in the mounting hole 52a of the printed circuit board 52.

The terminal portions 60a and 61a of the FPC's 60 and 61 and the circuit pattern 52b on the printed circuit board 52 are fixedly attached and electrically conducted by solder 63.

The recording/reproducing device 50 using the mounting structure of the FPC's 60 and 61 has a drawing: if the FPC holder 62 has an excess play when the FPC's 60 and 61 are soldered to the printed circuit board, either one or both of the terminal portions 60a and 61a of the FPC's 60 and 61 will fail to deviate from the position of the circuit pattern 52b of the printed circuit board 52, resulting in defective soldering of both or either one of the FPC's 60 and 61.

As an example of improvement effected to solve the problem of defective soldering, a recording/reproducing device 70 using the FPC mounting structure proposed by the applicant will be described with reference to FIGS. 13 and 14.

The printed circuit board 72 is provided with long mounting holes 72a, 72a formed as shown in FIG. 13.

The same number of guide holes 51a and 51b as the number of the FPC holders 82 are formed mutually adjacently into an about long-hole shape.

The chassis 51 has support projections 51c and 51e formed by cutting and raising a part of the guide holes 51a and 51b. These support projections 51c and 51e are formed in mutually deviated positions so that extensions prior to cutting and raising will not be overlapped with each other.

On the forward end of FPC's 80 and 81 a plurality of terminal portions 80a and 81a formed of a copper foil or other are exposed on the lower side. On the upper side of the terminal portions 80a and 81a, a circuit pattern extended into the base sections 80c and 81c of the FPC's 80 and 81 is routed in a laminate shape. The end portion on the base sections 80c and 81c side of the FPC's 80 and 81 is connected to the magnetic head 58.

On the back side of the FPC's 80 and 81 where the terminal portions 80a and 81a are not exposed, a double-faced adhesive tape is affixed, by which the FPC's 80 and 81 are attached to a later-described FPC holder 82.

The FPC holder 82 is a resinous member generally formed in a flat-plate shape. At the center of its one side, an approximately rectangular projecting portion 82a is formed projecting outwardly. The lower part of the projecting portion 82a is tapered. The lower end portion 82b is disposed to the lower portion, and terminal portions 80a and 81a of the FPC's 80 and 81 are attached.

On the lower portion of the FPC holder 82, in FIG. 13, first and second arm portions 82d and 82e are extended from the right and left sides in the direction of a central projecting portion 82a.

In the drawing, on the right side surface of the FPC holder 82 an elastically deformable hook-shaped retaining portion 82g is formed.

Furthermore, at the lower corners of the FPC holder 82, guide portions 82h and 82j are formed for positioning the terminal portions 80a and 81a of the FPC's 80 and 81. The terminal portions 80a and 81a positioned by the guide portions 82h and 82j are attached by a double-faced adhesive tape on the FPC holder 82.

The forward end of the FPC's 80 and 81 is bonded on the FPC holder 82. To attach this FPC holder 82 to the printed circuit board 72, the lower end portion 82b of the FPC holder 82 is inserted into the guide holes 51a and 51b of the chassis 51, and the portion between the first and second arm portions 82d and 82e is fitted on the support projections 51c and 51e. And also the lower end portion 82b of the FPC holder 82 and the terminal portions 80a and 81a are inserted in position in the mounting hole 72a of the printed circuit board 72, thereby aligning the terminal portions 80a and 81a with the circuit pattern of the printed circuit board 72.

The guide portions 82h and 82j of the FPC holder 82 are brought into contact with the surface of the printed circuit board 72, so that the insertion of the FPC holder 82 into the guide holes 51a and 51b and the mounting hole 72a stops thereat.

At this time, the retaining portions 82g, 82g are snapped into engagement with the guide holes 51a and 51b. The FPC holder 82 is fixedly retained in the guide holes 51a and 51b.

With the FPC holder 82 thus snapped into engagement with the guide holes 51a and 51b, the terminal portions 80a and 81a of the FPC's 80 and 81 protruding out of mounting hole 72a of the printed circuit board 72 and the circuit pattern of the printed circuit board 72 are connected by solder 63, to thereby electrically conduct the terminal portions 80a and 81a and the circuit pattern of the printed circuit board 72, thus assembling the mounting structure of the FPC's 80 and 81.

In the recording/reproducing device 70 using the FPC 80 and 81 mounting structure proposed, there will be left a 0.1 mm or larger clearance between the FPC holder 82 and the terminal portions 80a and 81a located in the mounting hole 72a of the printed circuit board 72. The solder 63 will flow into this clearance, failing in substantially securely attaching to a proper strength by soldering.

Therefore, it is likely that the terminal portions 80a and 81a of the FPC's 80 and 81 and the circuit pattern of the printed circuit board 72 can not reliably be electrically connected.

SUMMARY OF THE INVENTION

It is, therefore, an object of the present invention to provide an FPC mounting structure capable of easy soldering without producing a clearance between the FPC and the printed circuit board, and a recording/reproducing device using the same.

As a first means for solving at least one of the above problems, the present invention has a flexible printed circuit board having a terminal portion forming portion at which a terminal portion is formed in an exposed state on one side of the forward end an FPC holder having an elastic portion on the surface side and capable of mounting the terminal forming portion on the back side, a printed circuit board having a mounting hole, and a chassis located above the printed circuit board and having a guide hole for inserting the terminal portion into the mounting hole of the printed circuit board; the chassis being provided with a support projection formed by cutting and raising the edge portion of the guide hole. The FPC holder fitted with the terminal forming portion is inserted into the guide hole to elastically hold the elastic portion of the FPC holder in contact with the support projection, thereby pressing the terminal portion of the FPC against the edge portion of the printed circuit board mounting hole.

Furthermore, as a second means for solving the problem, the elastic portion is provided with an retaining engagement projection for preventing disengagement on the lower end of the FPC holder.

Furthermore, as a third means for solving the problem, the present invention uses the aforesaid flexible printed circuit board mounting structure.

The foregoing object and other objects, features and advantages of the present invention will become more apparent and understandable from the following detailed description thereof, when read in connection with the accompanying drawings.

DESCRIPTION OF THE PREFERRED EMBODIMENTS

Referring to FIGS. 1 to 10, a flexible printed circuit board (FPC) mounting structure and a recording/reproducing device 10 using the same according to the present invention will be described.

Figure 1:
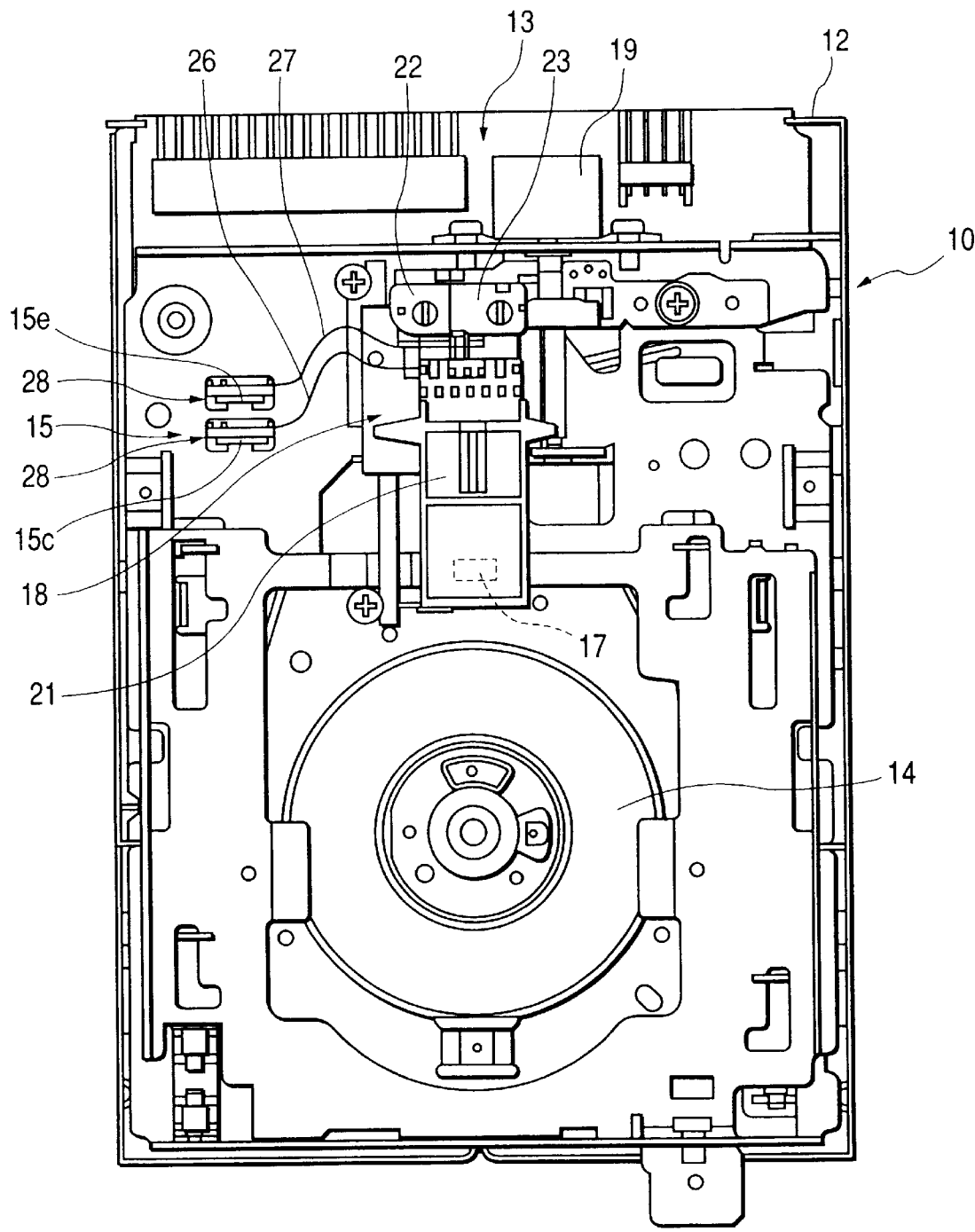
FIG. 1 is a plan view of one embodiment of a recording/reproducing device according to the present invention.

In the recording/reproducing device 10, as shown in FIG. 1, a square printed circuit board 13 with a circuit pattern 13b (FIG. 10) formed on the surface is attached upside down within a metal frame body 12 which is open in the upper part.

Figure 2:
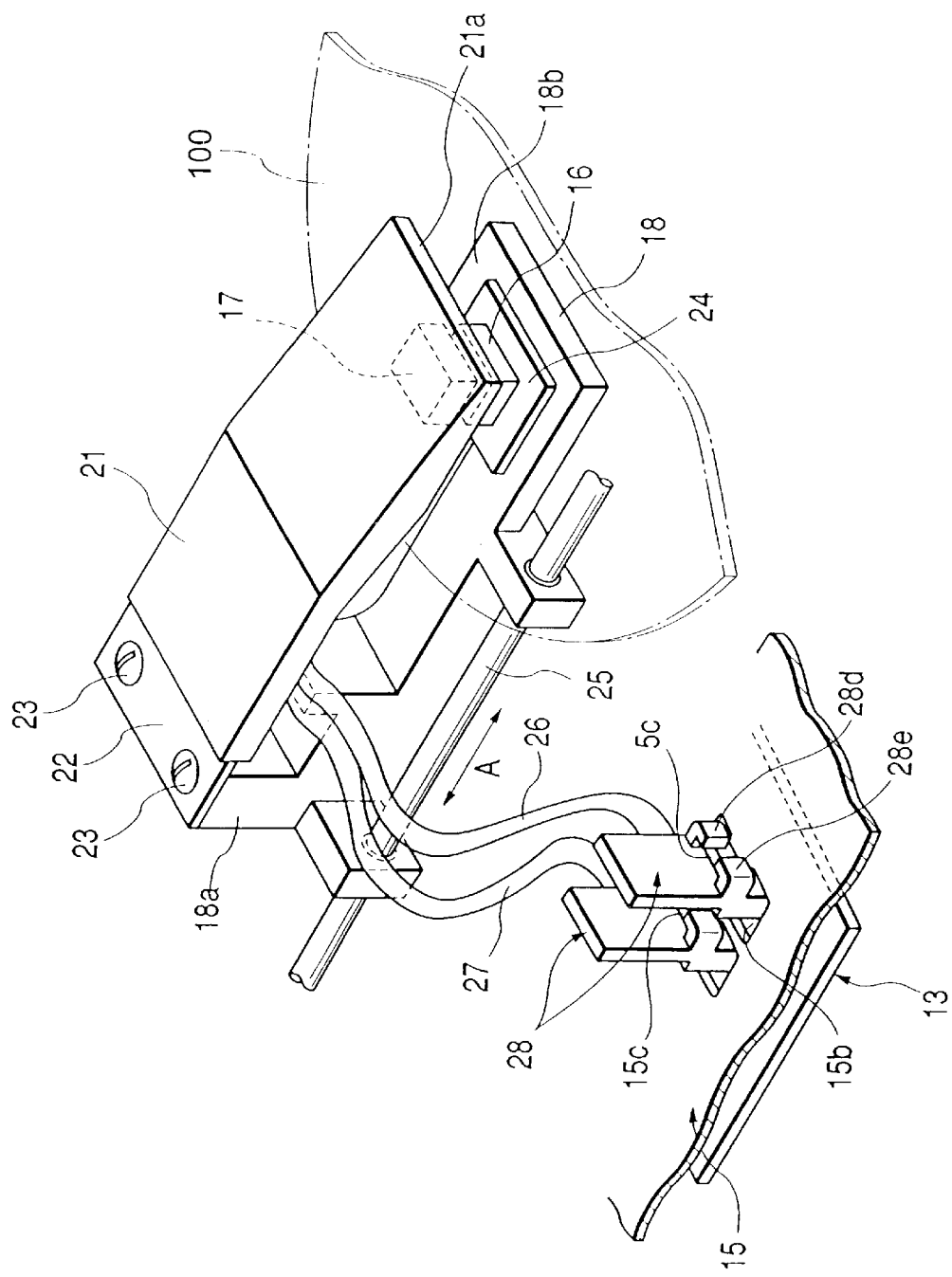
FIG. 2 is an enlarged perspective view showing a major portion of one embodiment of the recording/reproducing device according to the present invention.

Above the printed circuit board 13 there is mounted a metal chassis 15 on which a turntable 14 for loading and driving a recording disk 100 indicated by a single-dot chain line in FIG. 2 is rotatably installed.

Near the center of this chassis 15, a plastic carriage 18 is mounted, on which a pair of magnetic heads 16 and 17, upper and lower, are mounted in opposed positions. For reciprocally moving the carriage 18 in the direction of the arrow A in FIG. 2, a stepping motor 19 (see FIG. 1) is mounted on the chassis 15.

In the carriage 18, as shown in FIG. 2, a head mounting base 18a is mounted on the lower side and, above the head mounting base 18a, a head support arm 21 fixedly attached by a plurality of screws 23 through a flexible plate spring 22 is swingably mounted.

The pair of magnetic heads 16 and 17 are attached on the head mounting base 18a and the opposite surfaces 18b and 21a near the forward end of the head support arm 21 through a mounting plate 24.

The carriage 18 thus constituted is supported on a guide shaft 25, along which it can reciprocate in the direction of the arrow A.

Next, as shown in FIGS. 4 to 9, the FPC holder 28 is made of a flat plate-like resin material. On the lower end side at the center of its both surfaces, there is formed an approximately U-shaped cutout 28b. And surrounded by the cutout 28b is an approximately rectangular, flexible elastic portion 28a having a free end at the forward end.

On the free end side of the elastic portion 28a, a projection-like retaining portion 28c is provided, protruding slightly outwardly from the surface. On the lower end of the FPC holder 28, first and second arm portions 28d and 28e are bent to extend from the right and left sides in FIGS. 4 to 6 toward the elastic portion 28a located at center.

Figure 7:
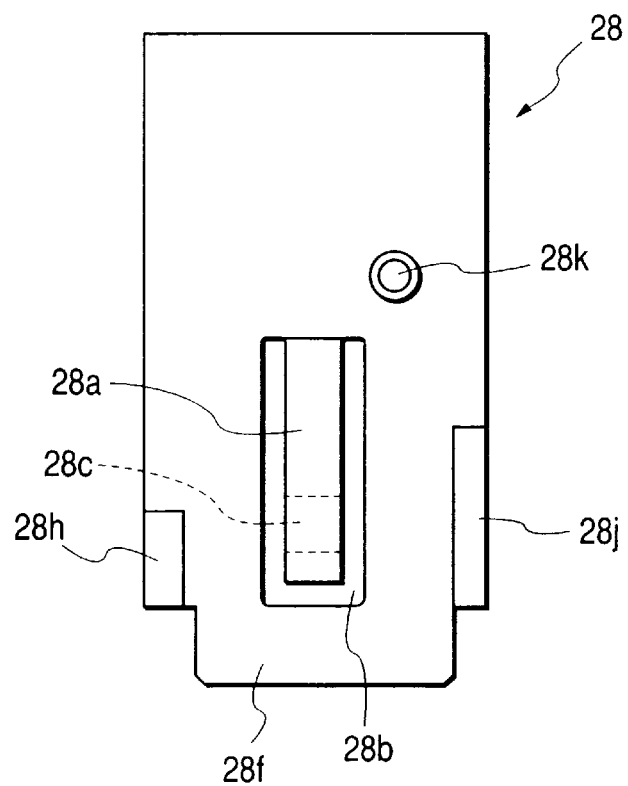
FIG. 7 is a bottom view of the FPC holder shown in FIG. 4.
Figure 8:
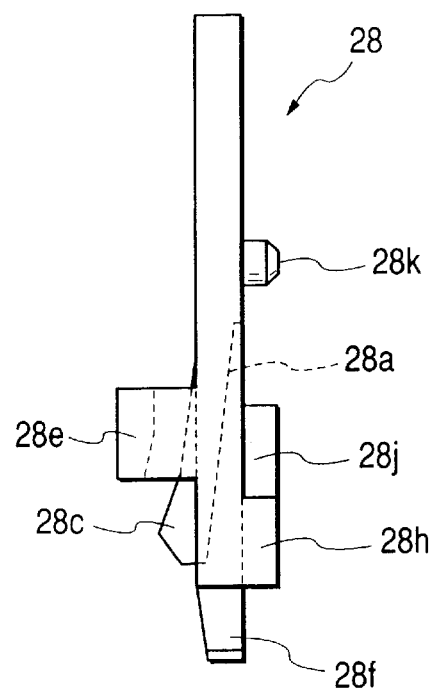
FIG. 8 is a right side view of the FPC holder shown in FIG. 4.
Figure 9:
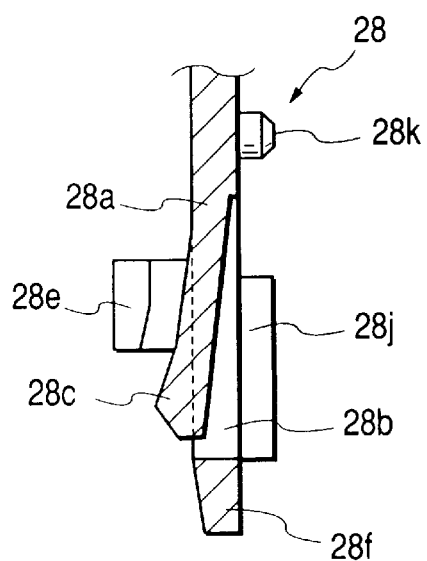
FIG. 9 is a sectional view of the FPC holder shown in FIG. 4.

Furthermore, rectangular guide portions 28h and 28j are formed projecting as shown in FIG. 7, at the lower corner on the back side of the FPC holder 28. Furthermore, at about the center of the back side, a columnar retaining engagement projection 28k is formed.

Furthermore, the FPC holder 28 has a lower end portion 28f decreased in plate thickness at the forward end.

Figure 3:
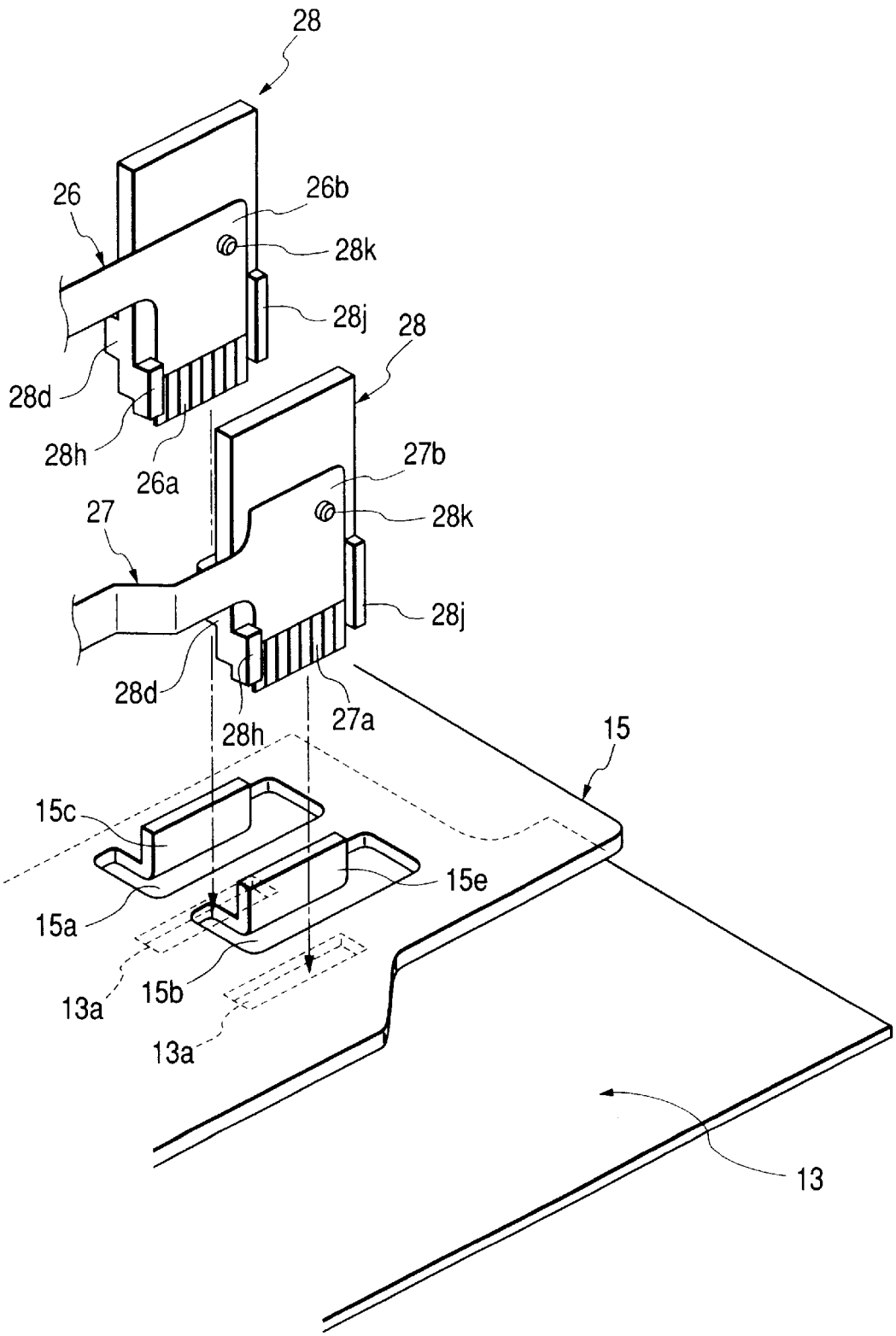
FIG. 3 is am exploded perspective view showing a major portion of an FPC holder mounting structure in one embodiment of the recording/reproducing device according to the present invention.
Figure 4:
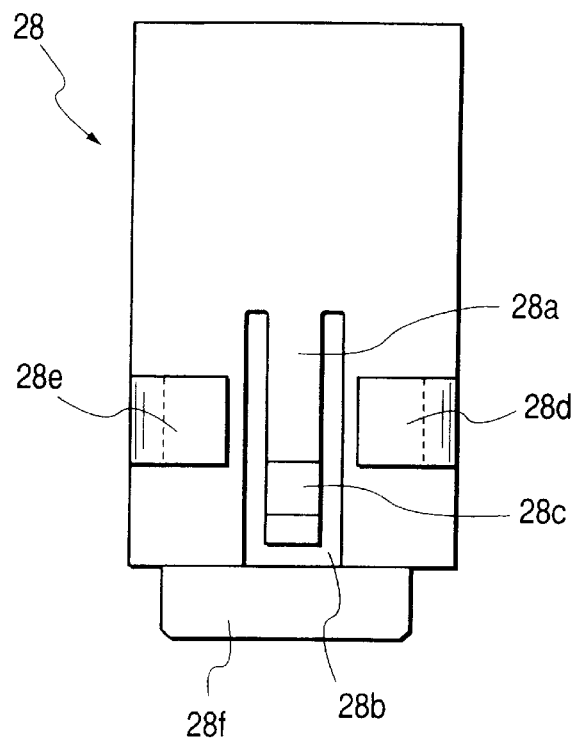
FIG. 4 is a top view of the FPC holder in one embodiment of the recording/reproducing device according to the present invention.
Figure 5:
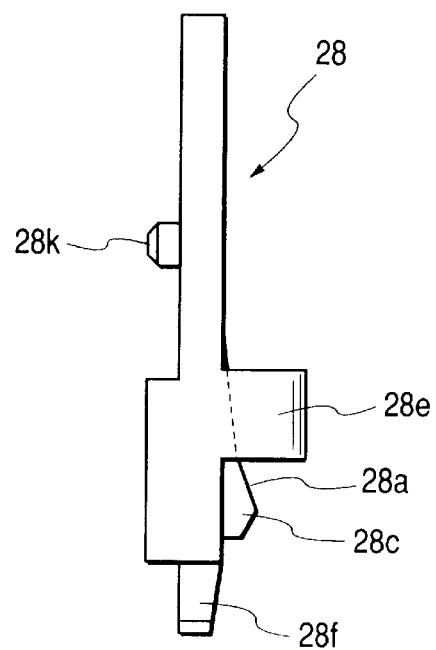
FIG. 5 is a left side view of the FPC holder shown in FIG. 4.
Figure 6:
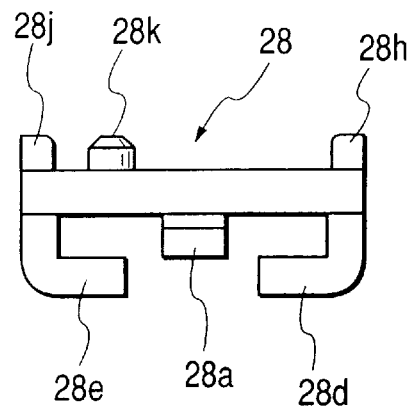
FIG. 6 is a plan view of the FPC holder shown in FIG. 4.

Next, the FPC's 26 and 27 are formed of a flexible plastic film as shown in FIG. 3; and an unillustrated circuit pattern is formed with its surface insulated by laminating on the film.

On the surface of the forward end of the FPC's 26 and 27, there are provided terminal forming portions 26b and 27b comprising a plurality of rectangular rounds formed of a copper foil with the terminal portions 26a and 27a exposed. The upper end portion of the terminal portions 26a and 27a is connected to the circuit pattern connected to each round.

The FPC's 26 and 27 are connected at one end side to the pair of magnetic heads 16 and 17, and guided and attached at the other end side by the guide portions 28h and 28j on the back side of the FPC holders 28, 28, so that the retaining engagement projections 28k, 28k of the FPC holders 28, 28 are hold through the FPC's 26 and 27.

On the printed circuit board 13, long mounting holes 13a, 13a are formed. The terminal portions 26a and 27a of the FPC's 26 and 27 and the lower end portion 28f of the FPC holder 28 are bonded together and inserted into the mounting holes 13a, 13a.

The chassis 15 mounted on the printed circuit board 13 is provided with the same number of rectangular guide holes 15a and 15b which are mutually adjacently formed as the number of the FPC holders 28, 28 in positions corresponding to the mounting holes 13a of the printed circuit board 13.

Furthermore, the chassis 15 is provided with support projections 15c and 15e formed by cutting and raising a part of the edge portion facing the guide holes 15a and 15b.

Next, mounting of the FPC 26 and the FPC holder 28 used in the recording/reproducing device 10 will be explained with reference to FIG. 10.

The FPC 27 having the same constitution as the FPC 26 is mounted in the same manner, and therefore will not be explained.

Figure 10:
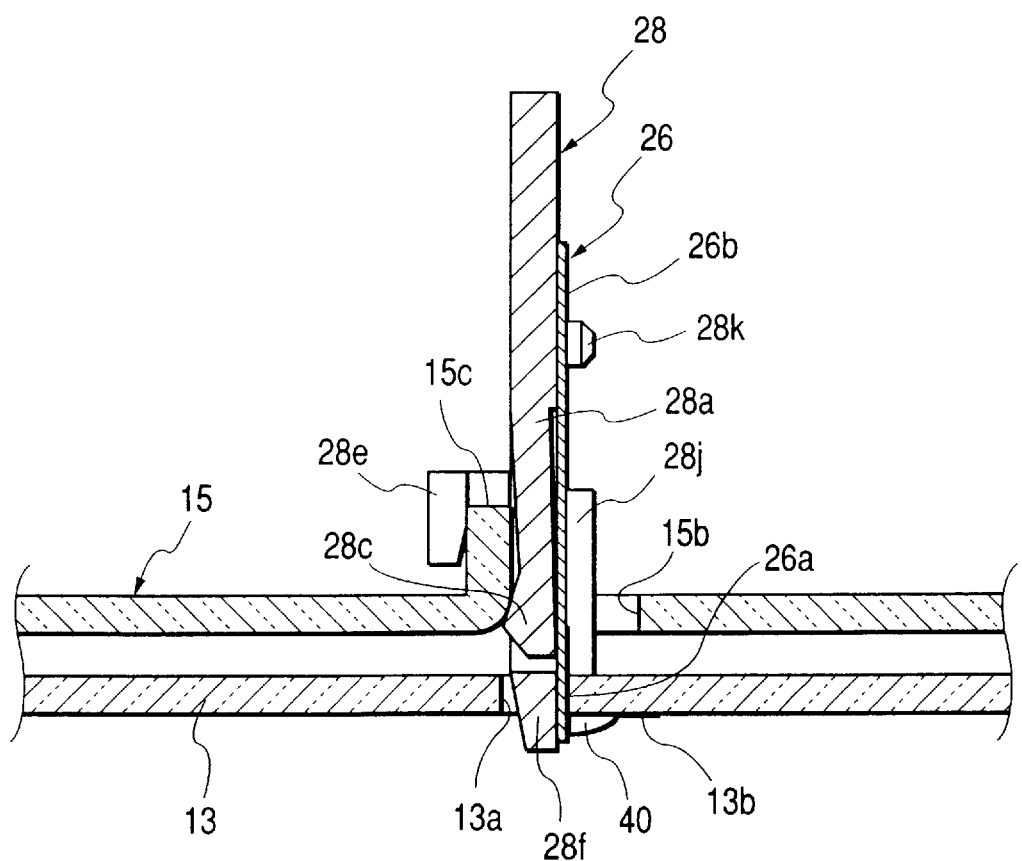
FIG. 10 is a sectional view showing the FPC holder in a mounted state in one embodiment of the recording/reproducing device according to the present invention.
Figure 11:
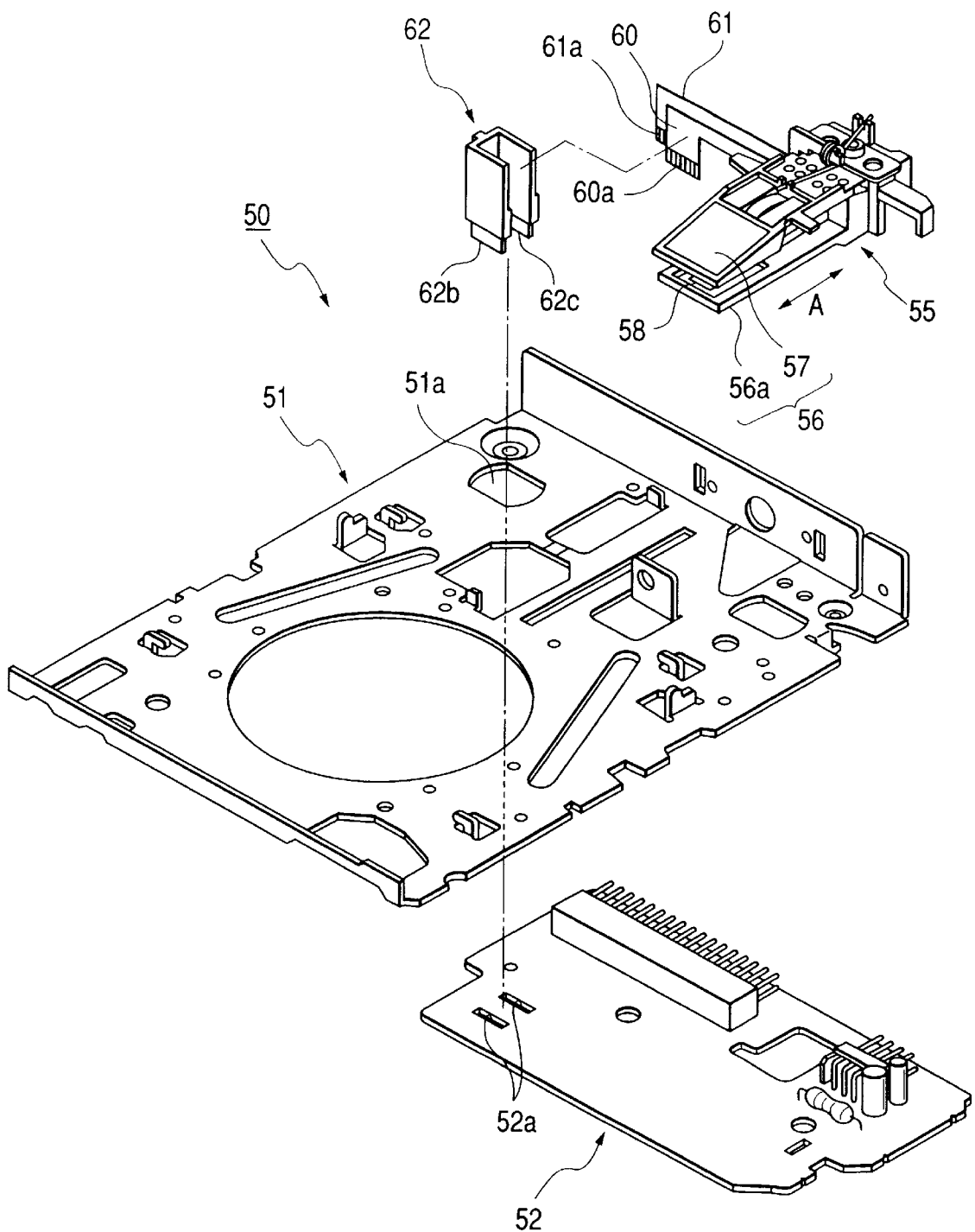
FIG. 11 is an exploded perspective view showing a major portion of a conventional recording/reproducing device.
Figure 12:
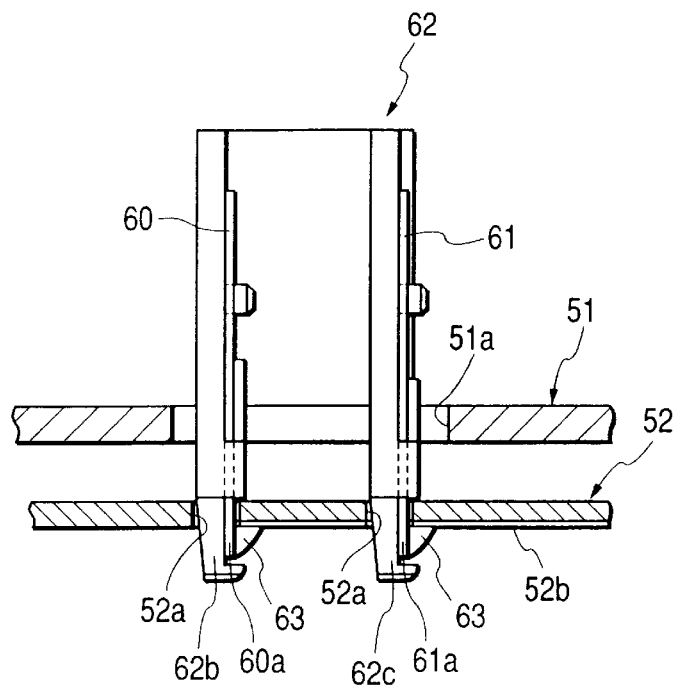
FIG. 12 is a sectional view of a major portion of the conventional recording/reproducing device.
Figure 14:
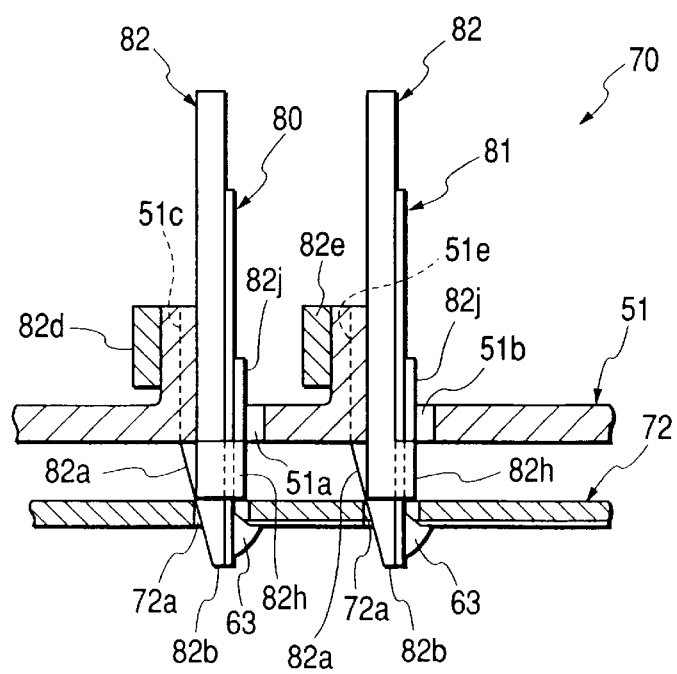
FIG. 13 is an exploded perspective view of a major explaining the FPC mounting structure of the recording/reproducing device proposed and FIG. 14 is a sectional view of a major portion of the recording/reproducing device shown in FIG. 13.
Figure 13:
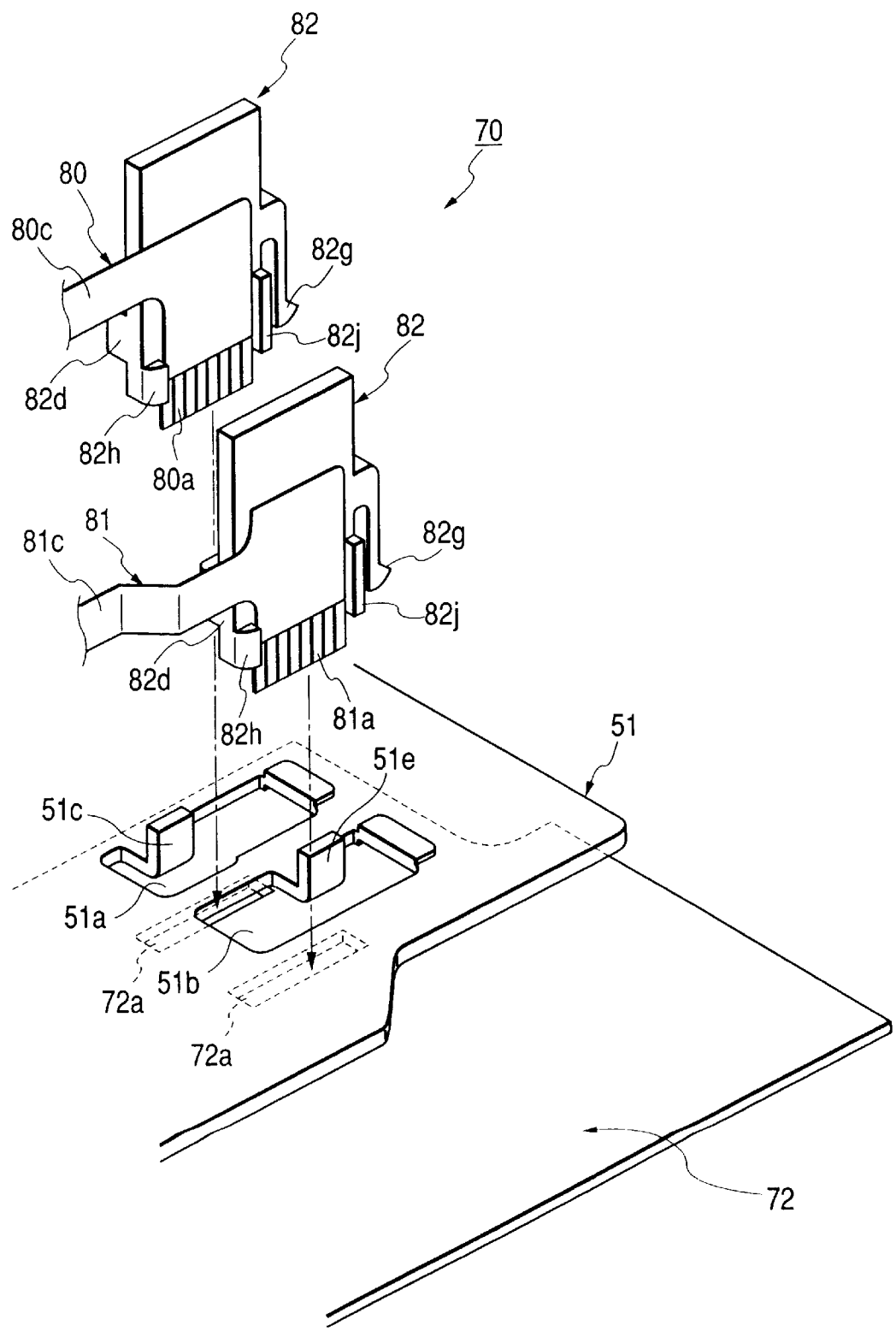

As shown in FIG. 10, in the terminal forming portion 26b of the FPC 26, a double-faced adhesive tape not shown is affixed on the side (back side) where the terminal portion 26a is not exposed, and the terminal forming portion 26b is attached by this double-faced adhesive tape to the surface between the guide portions 28h and 28j of the FPC holder 28.

At this time, the retaining engagement projection 28k of the FPC holder 28 fits in an unillustrated hole formed in the FPC 26, thereby properly position the FPC 26, together with the guide portions 28h and 28j, on the FPC holder 28. In this state, the lower ends of the terminal portions 26a and 27a are flush with the lower end 28f of the FPC holder 28.

Next, to attach the FPC holder 28 thus fitted with the FPC 26 to the printed circuit board 13, the lower end portion 28f of the FPC holder 28 is inserted into the guide hole 15b of the chassis 15, and the support projection 15c is fitted in the arm portions 28d and 28e of the FPC holder 28. Then, while sliding the elastic portion 28a of the FPC holder 18 in contact with the support projection 15c, the lower end portion 28f of the FPC holder 18 and the terminal portion 26a of the FPC26 are both inserted into the mounting hole 13a of the printed circuit board 13.

The lower ends of the guide portions 28h and 28j of the FPC holder 28 are brought into contact with the surface of the printed circuit board 13, thus stopping further insertion of the arm portions 28d and 28e of the FPC holder 28 over the support projection 15c, and insertion of the lower end portion 28f of the FCP holder 28 and the terminal portion 26a of the FPC 26 into the mounting hole 13a.

At this time, the retaining portion 28c of the elastic portion 28a is engaged with the bent portion of the support projection 15c, and the terminal portion 26a attached on the lower end portion 28f of the FPC holder 28 is pressed into contact, without a clearance, with the edge portion of the mounting hole 13a with an elastic force (reaction) of the retaining portion 28c, whereby the whole body of the FPC holder 28 is fixed in an inclined position.

Therefore, each round of the terminal portion 26a of the FPC 26 is in contact in a given position with the circuit pattern 13b of the printed circuit board 13.

With the FPC holder 28 fitted in the mounting hole 13a of the printed circuit board 13, the terminal portion 26a of the FPC 26 of a portion protruding out of the mounting hole 13a of the printed circuit board 13 and the circuit pattern 13b of the printed circuit board 13 are bonded by solder 40, so that the terminal portion 26a and the circuit pattern 13b of the printed circuit board 13 are electrically conducted, thus completing mounting of the FPC 26.

In the mounting structure of the FPC's 26 and 27 thus constituted and the recording/reproducing device 10 using the mounting structure, the carriage 18 is moved in the direction of the arrow A by the rotation driving force from the stepping motor 19 with the pair of magnetic heads 16 and 17 held in contact with the upper and lower sides of the magnetic disk 100 shown in FIG. 2. That is, while the carriage 18 reciprocates in the radial direction of the recording disk 100, the recording disk 100 is turned on the turntable 14 to perform recording, reproducing and deletion of information on the upper and lower sides of the recording disk 100.

The FPC mounting structure of the present invention is provided with an FPC having a terminal forming portion with a terminal portion formed, being exposed on one side of the forward end thereof, an FPC holder having an elastic portion on the surface side and capable of mounting the terminal forming portion on the back side, a printed circuit board having a mounting hole, and a chassis located above the printed circuit board and having a guide hole for inserting the terminal portion into the mounting hole of the printed circuit board. The chassis is provided with a support projection formed by cutting and raising the edge portion of the guide hole. The FPC holder fitted with the terminal forming portion is inserted into the guide hole so that the elastic portion of the FPC holder is in elastically contact with the support projection. And the terminal portion of the FPC is pressed against the edge portion of the mounting hole formed in the printed circuit board, whereby the elastic portion of the FPC holder is held in contact with the side wall of the chassis in the mounting hole. Therefore, the FPC holder is pressed by the reactive action of the elastic portion against one side of the mounting hole of the printed circuit board, thereby facilitating soldering of the FPC to the printed circuit board without any effect of clearance and accordingly enabling reliable electrical connection.

Furthermore, since the retaining engagement projection is provided on the lower end of the FPC holder for preventing disengagement, the elastic portion can simply snap the FPC holder into connection with a part of the chassis. Accordingly the FPC can be held with a pressure on one of the printed circuit board in the state of preventing disengagement, thus enabling easy soldering.

Furthermore, since the recording/reproducing device of the present invention uses the FPC mounting structure above-described, the FPC can easily be attached to the printed circuit board through the FPC holder.

What is claimed is:

1. A flexible printed circuit board mounting structure, comprising: a flexible printed circuit board having a terminal forming portion with a terminal portion exposed on one side of a forward end thereof; an FPC holder having an elastic portion on a surface side and capable of mounting the terminal forming portion on a back side; a printed circuit board having a mounting hole; and a chassis located above the printed circuit board and having a guide hole to insert the terminal portion into the mounting hole of the printed circuit board; the chassis being provided with a support projection formed by cutting and raising an edge portion of the guide hole; the FPC holder fitted with the terminal forming portion being inserted into the guide hole, to thereby elastically hold the elastic portion of the FPC holder in contact with the support projection; and the terminal portion of the FPC being pressed against the edge portion of the mounting hole formed in the printed circuit board.

2. A flexible printed circuit board mounting structure as claimed in claim 1, wherein the elastic portion is provided with a retaining engagement projection on a lower end of the FPC holder.

3. A recording/reproducing device using the flexible printed circuit board mounting structure as claimed in claim 1.

* * * * *